United States Patent [19]
Asai et al.

[11] Patent Number: 6,112,656
[45] Date of Patent: Sep. 5, 2000

[54] CREAMED-SOLDER PRINTING MACHINE

[75] Inventors: Koichi Asai, Nagoya; Takeyoshi Isogai, Hekinan; Manabu Mizuno, Okazaki; Jun Adachi, Nagoya, all of Japan

[73] Assignee: Fuji Machine Mfg. Co., Ltd., Chiryu, Japan

[21] Appl. No.: 09/247,013

[22] Filed: Feb. 9, 1999

[30] Foreign Application Priority Data

Feb. 18, 1998 [JP] Japan .................................. 10-036311

[51] Int. Cl.⁷ ................................................ B05C 17/04
[52] U.S. Cl. ............................................ 101/123; 101/473
[58] Field of Search .................................... 101/123, 473

[56] References Cited

U.S. PATENT DOCUMENTS

| | | |
|---|---|---|
| 3,949,666 | 4/1976 | Zimmer . |
| 4,485,736 | 12/1984 | Strutz, Jr. et al. ...................... 101/129 |
| 5,479,854 | 1/1996 | Chikahisa et al. . |
| 5,626,074 | 5/1997 | Zelko ....................................... 101/115 |
| 5,694,843 | 12/1997 | Chen ....................................... 101/123 |
| 5,791,243 | 8/1998 | Marcoux et al. ....................... 101/123 |

FOREIGN PATENT DOCUMENTS

| | | |
|---|---|---|
| 0 099 587 A2 | 2/1984 | European Pat. Off. . |
| 5-193105 | 8/1993 | Japan . |
| 7-76065 | 3/1995 | Japan . |
| WO 96/06737 | 3/1996 | WIPO . |

*Primary Examiner*—Ren Yan
*Assistant Examiner*—Darius N. Cone
*Attorney, Agent, or Firm*—Oliff & Berridge, PLC

[57] ABSTRACT

A creamed-solder printing machine for printing a creamed solder on a printed circuit board, including a screen having a plurality of holes, a squeegee which prints the creamed solder on the printed circuit board through the holes of the screen, a frame which supports the squeegee such that the squeegee is movable toward, and away from, the screen, and an elastic member which is provided between the frame and the squeegee and which produces a biasing force to bias the squeegee in a direction toward the screen.

8 Claims, 5 Drawing Sheets

CREAMED-SOLDER PRINTING MACHINE

BACKGROUND OF THE INVENTION

1. Field of the Invention

The present invention relates to a creamed-solder printing machine and particularly to the art of pressing a squeegee on a screen with a sufficiently great pressing force.

2. Related Art Statement

Japanese Patent Application laid open for public inspection under Publication No. 7-76065 discloses a creamed-solder printing machine which prints creamed solder on a printed circuit board ("PCB"). In this printing machine, a squeegee is held in contact with a screen having a plurality of holes, and at least one of the two members is moved relative to each other so as to print the creamed solder on the PCB through the holes of the screen. The pressing force with which the squeegee is pressed on the screen influences the quality of the printing. If the pressing force is too small, too much creamed solder may be printed on the PCB such that the solder rises from each of respective squeegee-side openings of the holes of the screen, and the solders rising from two or more adjacent holes may be connected to each other. On the other hand, if the pressing force is too great, the squeegee may sweep away the creamed solder which has entered each of the holes of the screen, and too little amount of solder may be printed on the PCB through the each hole of the screen. In the latter case, the durability of the squeegee or the screen may be lowered.

Hence, the creamed-solder printing machine disclosed in the above-identified document can adjust the pressing force with which the squeegee is pressed on the screen, so that an appropriate (not too much or not too little) amount of creamed solder may be printed on a PCB. However, in some cases, even the prior printing machine may not be able to produce a sufficiently great pressing force. More specifically explained, the squeegee is supported by a frame such that the squeegee is movable toward, and away from, the screen, and the squeegee is subject to a load that is the total weight of members, such as a squeegee-support member, which are moved with the squeegee when the squeegee is moved toward and away from the screen. Thus, the greatest pressing force with which the squeegee is pressed on the screen may be defined by the total weight of those members, and the thus defined greatest pressing force may be insufficient in some cases. The pressing force may be increased by employing, as the members which are moved with the squeegee relative to the screen, members each having a larger size, or members each having a greater specific gravity. However, when those members are moved relative to the screen in the printing operation, a large vibration is produced because the great mass is moved. In addition, those members may interfere with other members. Thus, it is difficult to employ, as the members which are moved with the squeegee, members each having a large size, or members each having a great specific gravity.

In the above-indicated background, it is possible to employ a pressurized-air-operated cylinder device ("air cylinder") for pressing a squeegee on a screen. However, the air cylinder is provided with one or more sealing members which is or are provided between respective sliding surfaces of a piston or a piston rod and a cylinder housing. The sealing member or members produces or produce a great frictional resistance, in particular in the case where the pressure of a work fluid is high. In addition, the frictional resistance is not stable and accordingly the pressing force with which the squeegee is pressed on the screen is varied. Thus, an accurate and uniform printing is not obtained on a PCB.

SUMMARY OF THE INVENTION

It is therefore an object of the present invention to provide a creamed-solder printing machine which presses a squeegee on a screen with a sufficiently great and uniform pressing force.

The present invention provides a creamed-solder printing machine which has one or more of the technical features that are described below in respective paragraphs given parenthesized sequential numbers (1) to (10). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the appropriate combinations thereof are just examples to which the present invention is by no means limited.

(1) According to a first feature of the present invention, there is provided a creamed-solder printing machine for printing a creamed solder on a printed circuit board, comprising a screen having a plurality of holes; a squeegee which prints the creamed solder on the printed circuit board through the holes of the screen; a frame which supports the squeegee such that the squeegee is movable toward, and away from, the screen; and at least one elastic member which is provided between the frame and the squeegee and which produces a biasing force to bias the squeegee in a direction toward the screen. In the present creamed-solder printing machine, the squeegee is subjected to a load including the biasing force of the elastic member in addition to the total weight of elements which are moved with the squeegee when the squeegee is moved toward, and away from, the screen. Thus, even in the case where an appropriate pressing force with which the squeegee is pressed on the screen is greater than the total weight of the elements which are moved with the squeegee, the appropriate pressing force can be obtained by utilizing the biasing force of the elastic member. Therefore, an appropriate amount of creamed solder can be printed on the printed circuit board ("PCB"). In addition, the elastic member is free from the problem of slide resistance that is produced when the squeegee is pressed on the screen by a so-called air cylinder. Therefore, a uniform pressing force can be obtained and accordingly the creamed solder can be printed with accuracy. The present printing machine may comprise a single elastic member or a plurality of elastic members. In the latter case, it is preferred that the plurality of elastic members be provided at respective positions which are distant from each other in a longitudinal direction of the squeegee.

(2) According to a second feature of the present invention that includes the first feature (1), the printing machine further comprises an adjustable-force applying device which is provided between the frame and the squeegee and which applies, to the squeegee, an adjustable force in a direction in which the adjustable force resists the biasing force of the elastic member. In the present printing machine, the adjustable-force applying device decreases the pressing force with which the squeegee is pressed on the screen. Thus, the pressing force can be adjusted by adjusting the adjustable force applied to the squeegee by the adjustable-force applying device. Therefore, the most appropriate pressing force can be obtained.

(3) According to a third feature of the present invention that includes the second feature (2), the adjustable-force applying device comprises at least one pressurized-fluid-operated cylinder device which includes a piston, a piston rod, and a cylinder housing; and a pressurized-fluid supplying device which supplies a pressurized fluid to the pressurized-fluid-operated cylinder device and adjusts a pressure of the pressurized fluid, and one of the piston rod and the cylinder housing is supported by the frame, the other of the piston rod and the cylinder housing is connected to the squeegee, and the elastic member is provided between the frame and the other of the piston rod and the cylinder housing. The fluid may be a gas such as air or nitrogen, or a liquid such as oil. The other of the piston rod and the cylinder housing that is connected to the squeegee is biased by the elastic member, in a direction in which the squeegee is moved toward the screen. Thus, the adjustable force resisting the elastic force of the elastic member can be increased or decreased by adjusting the pressure of the pressurized fluid supplied to the pressurized-fluid-operated cylinder device. Therefore, the pressing force with which the squeegee is pressed on the screen can be adjusted to a desirable value. The present printing machine may comprise a single pressurized-fluid-operated cylinder device or a plurality of pressurized-fluid-operated cylinder devices. In the latter case, it is preferred that the plurality of cylinder devices be provided at respective positions which are distant from each other in a longitudinal direction of the squeegee.

(4) According to a fourth feature of the present invention that includes the third feature (3), the pressurized-fluid-operated cylinder device comprises a pressurized-air-operated cylinder device, and wherein the piston and the piston rod of the pressurized-air-operated cylinder device are slideable on an inner surface of the cylinder housing thereof, without any sealing members provided therebetween. The present pressurized-air-operated cylinder device ("air cylinder") has no sealing members between the piston thereof or the piston rod thereof and the inner surface of the cylinder housing thereof, unlike common air cylinders. Instead, the present air cylinder has substantially no clearance between them. Thus, the piston and the piston rod of the air cylinder are slideable on the inner surface of the cylinder housing. Consequently the present air cylinder is free from the problem that the adjustable force resisting the biasing force of the elastic member is varied because of a frictional force which would be produced by one or more sealing members. Therefore, the accuracy of adjustment of the pressing force with which the squeegee is pressed on the screen is improved. Even in the case where the pressurized-fluid-operated cylinder device has one or more sealing members between the piston or the piston rod and the inner surface of the cylinder housing, the influence of the frictional force of the sealing member or members can be reduced by using the elastic member, as compared with the case where no elastic member is used. For example, in the case where there is a great difference between a pressing force needed to press the squeegee on the screen, and the total weight of the elements that are moved with the squeegee, the great difference may be compensated for by an operating force produced by the pressurized-fluid-operated cylinder device. To this end, however, the fluid supplied to the cylinder device needs a high pressure, which leads to amplifying the above-described influence of the frictional force of the sealing member or members. Alternatively, the great difference may be compensated for by the biasing force (i.e., the elastic force) of an elastic member, and the cylinder device may be used to produce an adjustable force partly resisting the biasing force. In the latter case, the pressing force with which the squeegee is pressed on the screen can be adjusted by adjusting the adjustable force of the cylinder device, and accordingly the fluid supplied to the cylinder device does not need so high a pressure, which leads to reducing the influence of the frictional force of the sealing member or members. In contrast, the present creamed-solder printing machine employs, as the cylinder device, an air cylinder which does not include any sealing members between the piston thereof or the piston rod thereof and the inner surface of the cylinder housing thereof. Therefore, the air cylinder is free from the problem of the frictional force of the sealing members. Thus, the present printing machine can fully enjoy the advantage obtained by pressing the squeegee on the screen by using the elastic member in place of the air cylinder. In addition, in the case of the air cylinder, there arises no problem even if air as the working fluid may leak therefrom because no sealing member is employed therein. Since the present air cylinder is free from the influence of the frictional force of the sealing member or members, the above-described great difference may be compensated for by using only the operating force of the present air cylinder, without using the biasing force of the elastic member.

(5) According to a fifth feature of the present invention that includes the third or fourth feature (3) or (4), the printing machine further comprises a universal joint with which at least one of the piston rod and the cylinder housing is connected to a corresponding one of the frame and the squeegee. If the pressurized-fluid-operated cylinder device receives a force to tilt the piston or the piston rod relative to the cylinder housing, or vice versa, the piston or the piston rod tends to be temporarily caught in the cylinder housing, which may remarkably increase the frictional force of the cylinder device. This tendency increases as the clearance between the piston or the piston rod and the inner surface of the cylinder housing decreases. This phenomenon can be effectively avoided by connecting the cylinder device to an object via a universal joint. Therefore, the best effect can be obtained by combining the present, fifth feature (5) with the fourth feature (4). However, the principle of the present invention does not exclude the employment of a pressurized-fluid-operated cylinder device having one or more sealing members. In the latter case, the frictional force of the cylinder device can be reduced to some extent by employing a universal joint.

(6) According to a sixth feature of the present invention that includes any one of the third to fifth features (3) to (5), the piston rod is supported by the frame, and the cylinder housing is connected to the squeegee. The piston rod may be directly supported by the frame. However, the frame may support a pressurized-fluid-operated cylinder device as a squeegee elevating and lowering device which elevates and lowers the squeegee, and a piston rod of that cylinder device may be connected to the piston rod of the pressurized-fluid-operated cylinder device as the adjustable-force applying device. In the latter case, the piston rod of the cylinder device as the adjustable-force applying device is indirectly supported by the frame via the cylinder device as the squeegee elevating and lowering device.

(7) According to a seventh feature of the present invention that includes any one of the third to sixth features (3) to (6), the printing machine further comprises a squeegee supporting device which supports the squeegee and which is connected to the other of the piston rod and the cylinder housing that is connected to the squeegee. In the present printing machine, the squeegee is connected via the squeegee supporting device to the other of the piston rod and the cylinder housing of the cylinder device as the adjustable-force applying device. Thus, the squeegee is pressed on the screen with the biasing force of the elastic member and the total weight of the squeegee supporting device and the squeegee itself.

This biasing force can be reduced by the adjustable-force applying device.

(8) According to an eighth feature of the present invention that includes the seventh feature (7), the squeegee supporting device comprises a linearly movable member which is supported by the frame such that the linearly movable member is movable along a first straight line perpendicular to the screen; and a pivotable member which is connected to the linearly movable member such that the pivotable member is pivotable about a second straight line perpendicular to the first straight line and parallel to the screen, the squeegee being supported by the pivotable member. The second straight line is parallel to a direction in which the screen and the squeegee are moved relative to each other. The linearly movable member is linearly moved relative to the frame by the cylinder device as the adjustable-force applying device, or the cylinder device as the squeegee elevating and lowering device, so that the squeegee is contacted with, and separated from, the screen. Even if the screen may be inclined relative to the linearly movable member, the inclination is accommodated by the pivotal motion of the pivotable member, so that the squeegee is pressed on the screen with a uniform force and accordingly the creamed solder is uniformly printed on the PCB.

(9) According to a ninth feature of the present invention that includes any one of the second to eighth features (2) to (8), the printing machine further comprises a squeegee supporting device which supports the squeegee and which is supported by the frame via the adjustable-force applying device; and a pressing-force detecting device which is supported by the squeegee supporting device and which detects a pressing force of the squeegee applied to the screen. According to this feature (9), an operator may manually adjust the adjustable force of the adjustable-force applying device, in view of the pressing force detected by the pressing-force detecting device. Alternatively, the present creamed-solder printing machine may further comprise an adjustable-force adjusting device which automatically adjusts the adjustable force of the adjustable-force applying device, according to the following, tenth feature (10). In the latter case, the printing machine can be more easily used.

(10) According to a tenth feature of the present invention that includes the ninth feature (9), the printing machine further comprises an adjustable-force adjusting device which is connected to the pressing-force detecting device and the adjustable-force applying device and which automatically adjusts the adjustable force of the adjustable-force applying device such that the pressing force detected by the pressing-force detecting device is equal to a reference value.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter, there will be described a creamed-solder printing machine to which the present invention is applied.

Figure 3:
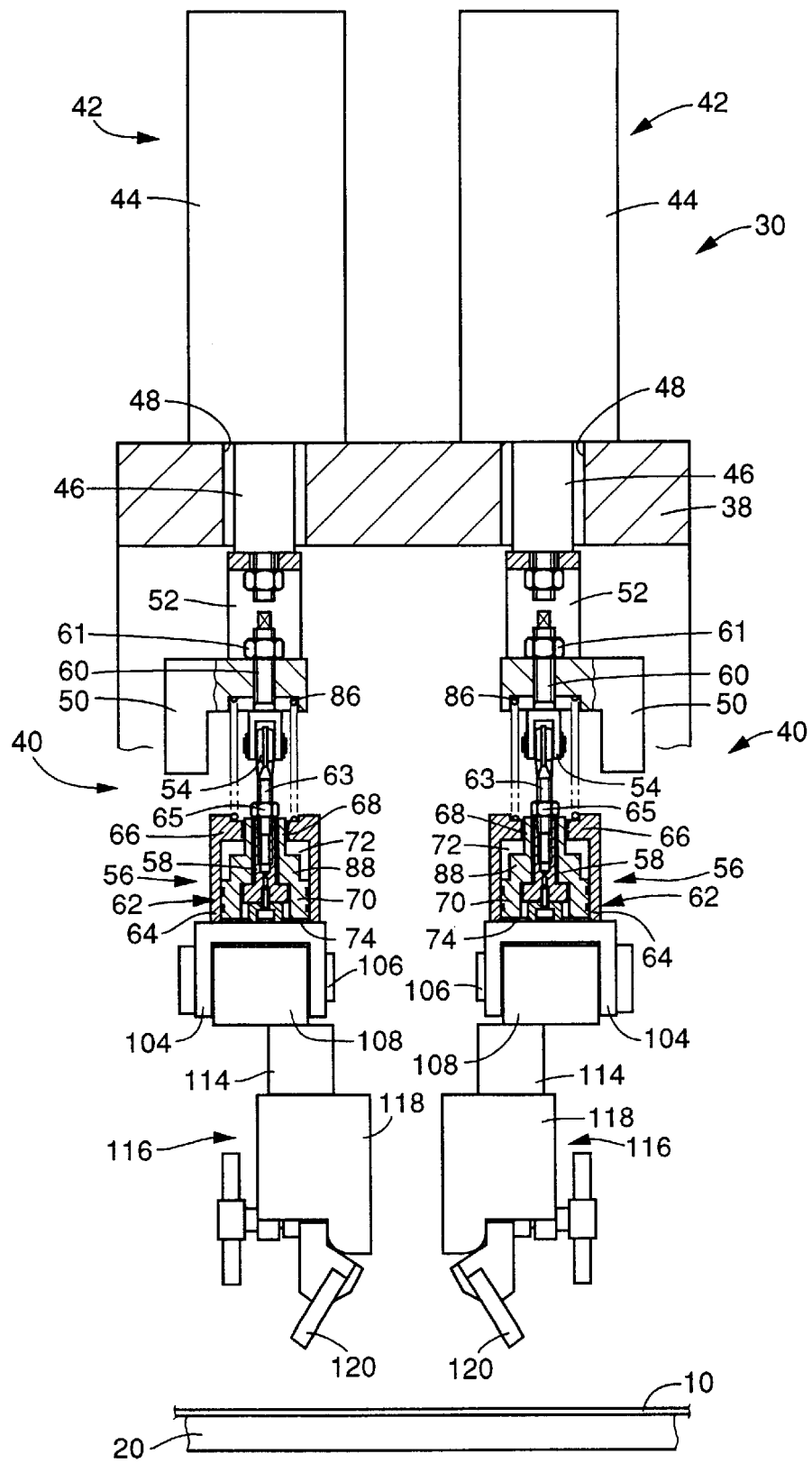
FIG. 3 is a partly cross-sectioned, side elevation view of the squeegee device of FIG. 2.

In FIG. 3, reference numeral 10 designates a screen. The screen 10 has a plurality of holes (not shown) formed through the thickness thereof, and the outer periphery of the screen 10 is fixed to a screen frame (not shown). The screen frame is placed on a stationary screen-support table (not shown), such that the screen frame is positioned by a positioning device (not shown) in each of an X-axis direction parallel to a left-to-right direction in FIG. 3 and a Y-axis direction perpendicular to the X-axis direction and parallel to a left-to-right direction in FIG. 1, and is fixed to the screen-support table by a fixing device (not shown).

When the creamed-solder printing machine prints creamed solder, first, a printed circuit board ("PCB") 20 is held in contact with the lower surface of the screen 10, as shown in FIG. 3. More specifically described, the PCB 20 is carried in by a PCB conveyor (not shown) in the X-axis direction, and is placed on a PCB-support table (not shown) under the screen 10. Subsequently, the PCB-support table is moved upward so that the PCB 20 is contacted with, and moved away from, the screen 10. After the creamed solder is printed on the PCB 20, the PCB 20 is carried out by the PCB conveyor in the X-axis direction.

Figure 1:
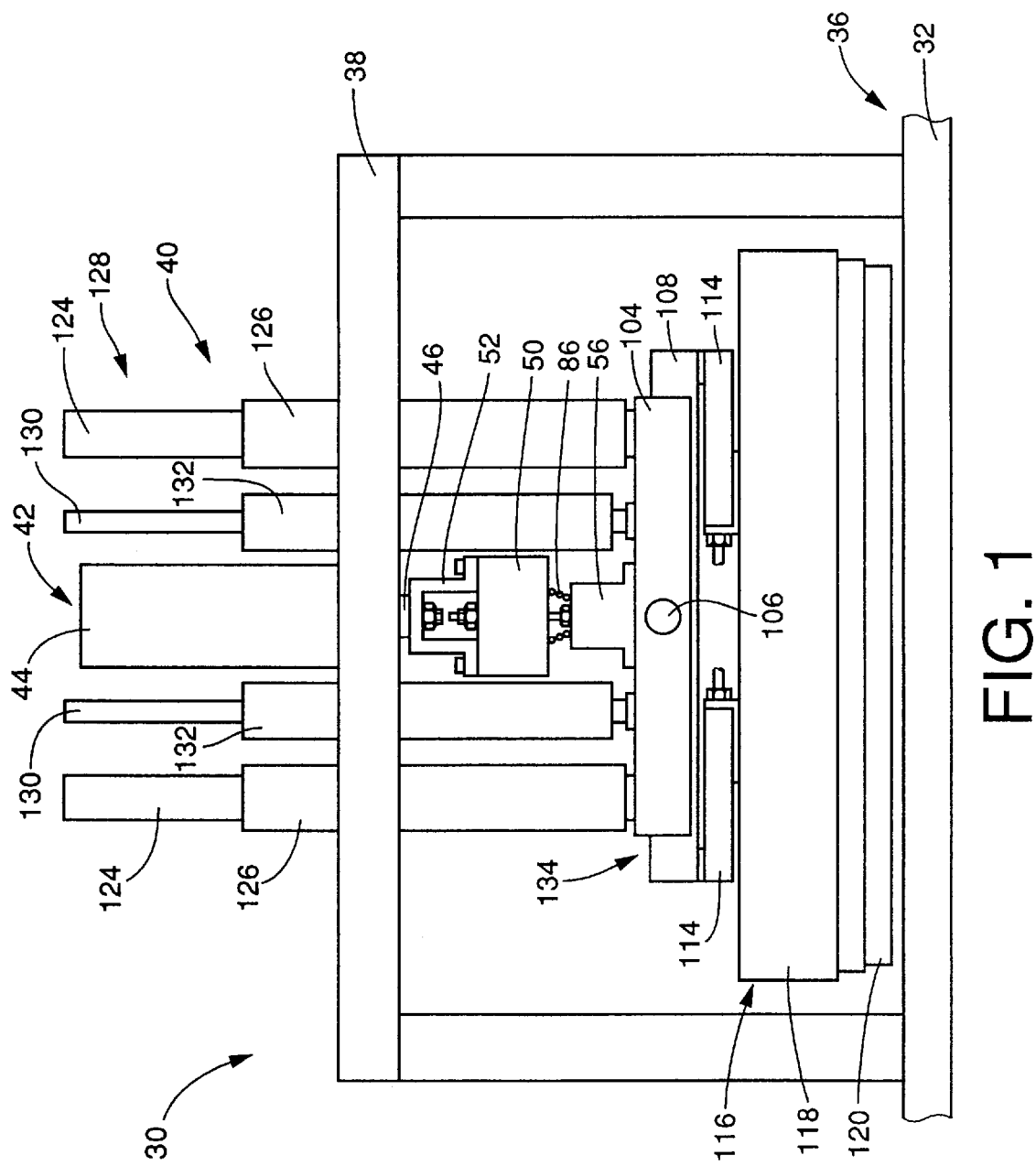
FIG. 1 is a front elevation view of a creamed-solder printing machine to which the present invention is applied.

The creamed-solder printing machine includes a squeegee device 30 which prints the creamed solder on the PCB 20 through the holes of the screen 10. As shown in FIG. 1, the squeegee device 30 includes an X-axis slide 32 as a movable member which is movable in the X-axis direction. The X-axis slide 32 is supported by a stationary support member (not shown) such that the slide 32 is movable in the X-axis direction. The X-axis slide 32 is moved in the X-axis direction by an X-axis moving device including a servomotor 34 (FIG. 5) as a drive source and a motion converting device which includes a nut and a ball screw as a sort of feed screw and which converts the rotation of the servomotor 34 into the linear movement of the slide 32. The X-axis slide 32 and the X-axis moving device cooperate with each other to provide a squeegee moving device 36. The movement of the X-axis slide 32 is guided by a guide device including at least one guided member provided on the X-axis slide 32 and at least one guide member provided on the stationary support member. The servomotor 34 is an electric rotary motor as a sort of electric motor, and is a motor which is accurately controllable with respect to its rotation angle and speed. The servomotor 34 may be replaced with a stepper motor.

Figure 2:
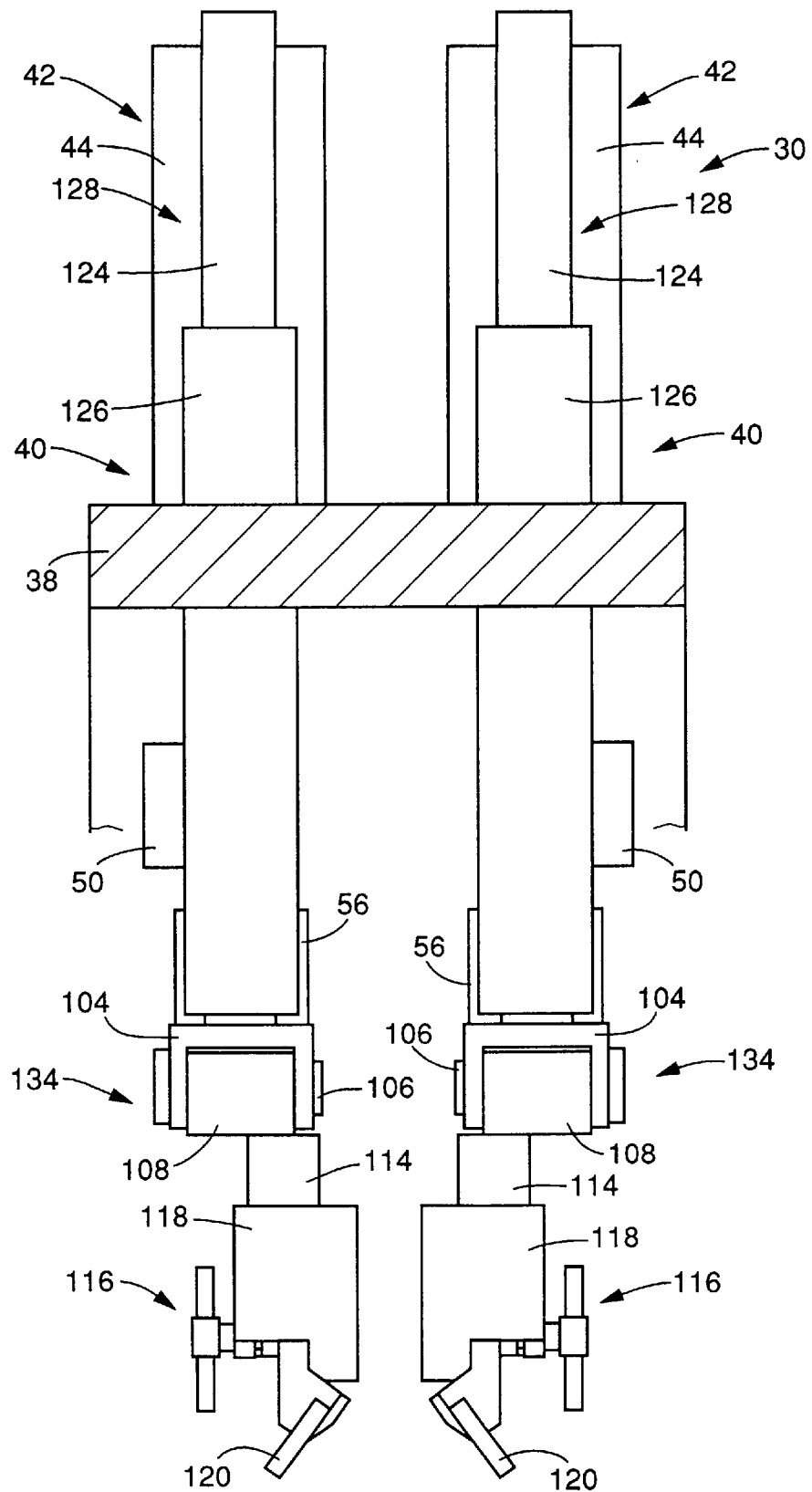
FIG. 2 is a side elevation view of a squeegee device of the printing machine of FIG. 1.

A frame 38 is provided on the X-axis slide 32 and, as shown in FIG. 1, has a generally inverted-U-shaped configuration. The frame 38 supports two squeegee units 40, as shown in FIG. 2, each of which is moved in the X-axis direction by the squeegee moving device 36. In the present embodiment, the X-axis direction is a squeegee-move direction in which each of the two squeegee units 40 is moved, and a screen-print direction in which the creamed solder is screen-printed by the each squeegee unit 40. The two squeegee units 40 are symmetric with each other with respect to a plane which is perpendicular to the screen 10 and the squeegee-move direction. However, since the two units 40 have an identical construction, one of the two units 40 will be described below as a representative of them.

As shown in FIG. 3, the frame 38 supports a pressurized-air-operated cylinder device 42 (hereinafter, referred to as the "air cylinder" 42) of the squeegee unit 40, such that the air cylinder 42 is oriented downward. The air cylinder 42 includes a cylinder housing 44 fixed to the frame 38, and a piston rod 46 projecting downward from the cylinder housing 44 and extending through a hole 48 formed through the thickness of the frame 38. A lower end portion of the piston rod 46 is fixed to a bracket 52 fixed to a spring retainer 50. A piston rod 58 of another air cylinder 56 is connected to the spring retainer 50 via a universal joint 54. The universal joint 54 includes an externally threaded portion 60, and is fixed to the spring retainer 50 by the cooperation of the threaded portion 60 and an internally threaded nut 61 screwed on the threaded portion 60. The universal joint 54 additionally includes another externally threaded portion 63, and the piston rod 58 is fixed to the universal joint 54 by the cooperation of the threaded portion 63 and a nut 65 screwed on the threaded portion 63. The air cylinders 42, 56 are a sort of pressurized-fluid-operated cylinder devices, and the pressurized-fluid-operated cylinder devices are a sort of pressurized-fluid-operated actuator as a drive source.

Figure 4:
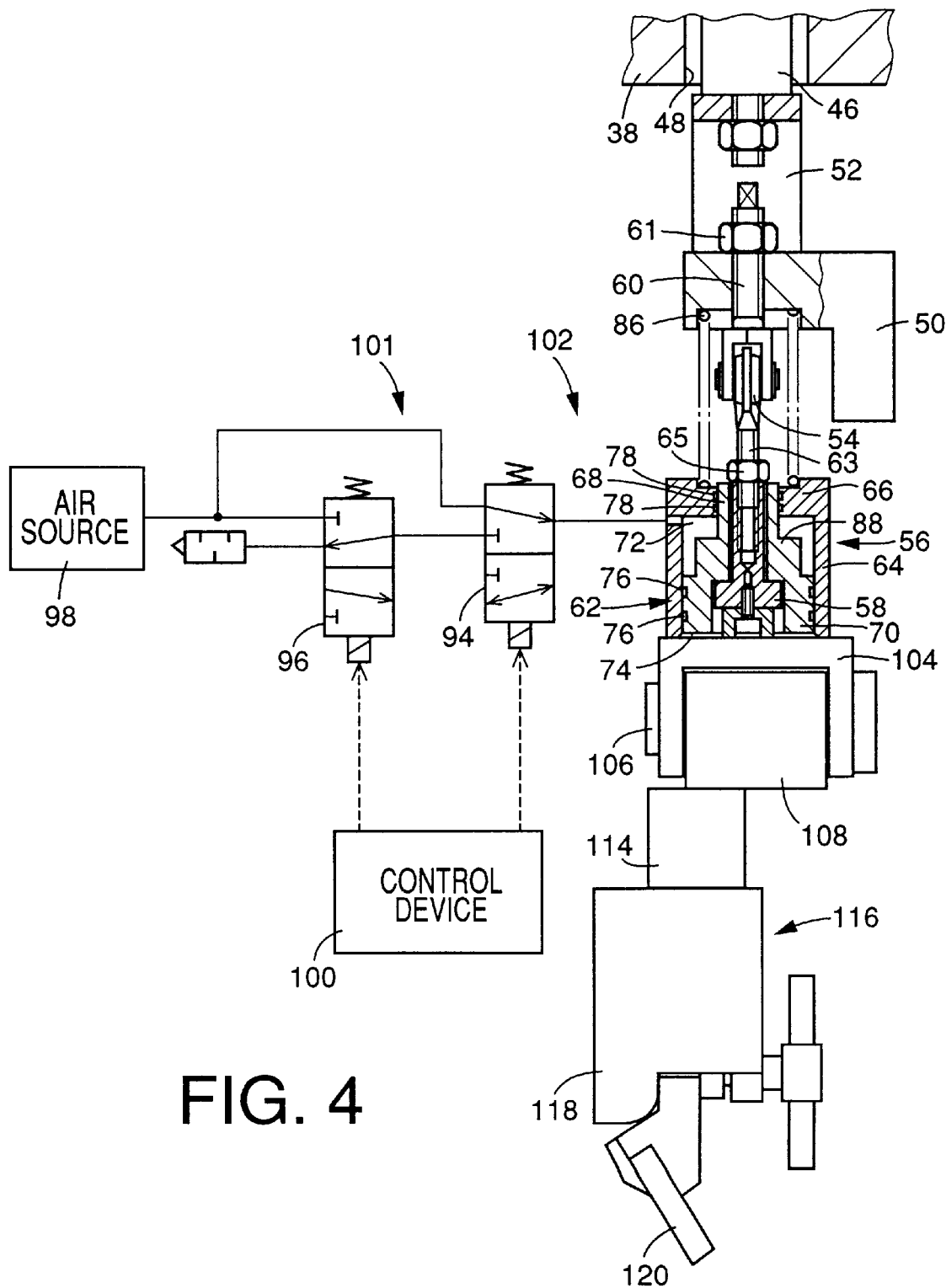
FIG. 4 is a view for explaining a pressing-force adjusting air cylinder and a pressurized-air-supply circuit for supplying a pressurized air to the air cylinder.

A stepped piston 62 is fitted on the piston rod 58 such that the piston 62 is not movable downward relative to the rod 58. The piston 62 is fitted in a cylindrical cylinder housing 64 such that the piston 62 is slideable on an inner circumferential surface of the housing 64. The cylinder housing 64 has a bottom wall 66, and is oriented downward. The piston 62 includes a small-diameter portion 68 which is fitted in a hole formed through the thickness of the bottom wall 66 and which functions as a piston rod. The piston 62 additionally includes a large-diameter portion 70 which cooperates with the bottom wall 66 of the cylinder housing 64 to define an air chamber 72. An atmospheric-pressure chamber 74 is provided below the large-diameter portion 70 of the piston 62. No sealing member is provided between the small-diameter portion 68 of the piston 62 and the inner circumferential surface of the bottom wall 66 of the cylinder housing 64, or between the large-diameter portion 70 and the inner circumferential surface of the cylindrical side wall of the housing 64. However, the piston 62 is substantially airtightly fitted in the cylinder housing 64, because substantially no clearance is provided between the small-diameter portion 68 of the piston 62 and the inner circumferential surface of the bottom wall 66 of the housing 64, or between the large-diameter portion 70 and the inner circumferential surface of the cylindrical side wall of the housing 64. As shown in FIG. 4, two annular clearance grooves 76 are formed in the outer circumferential surface of the large-diameter portion 70 of the piston 62, and two annular clearance grooves 78 are formed in the inner circumferential surface of the bottom wall 66 of the housing 64. Though substantially no clearance is provided between the small-diameter portion 68 and the inner circumferential surface of the bottom wall 66, or between the large-diameter portion 70 and the inner circumferential surface of the cylindrical side wall of the housing 64, the piston 62 is smoothly slideable relative to the housing 64 owing to the two pairs of annular clearance grooves 76, 78.

A compression coil spring 86 as a sort of elastic member is provided between the spring retainer 50 and the cylinder housing 64, and biases the housing 64 downward. The limit of the downward movement of the housing 64 because of the biasing action of the coil spring 86 is defined by butting of the bottom wall 66 of the housing 64 against a medium-diameter portion 88 of the piston 62 that is provided as a stopper portion between the small-diameter and large-diameter portions 68, 70 of the piston 62. The position of the spring retainer 50 relative to the universal joint 54 can be changed by changing the amount of screwing or engagement of the nut 61 on or with the threaded portion 60 of the joint 54, and a set load of the compression coil spring 86 can be adjusted by changing the relative position.

The air chamber 72 is selectively communicated with either one of a pressurized-air supply source 98 (referred as the "air source 98") and the atmosphere, by respective switching operations of two solenoid-operated direction control valves 94, 96 (referred to as the "solenoid valves 94, 96"). Consequently the cylinder housing 64 is elevated and lowered. The first solenoid valve 94 is of a large size which allows a large amount of pressurized air to flow therethrough, and the second solenoid valve 96 is of a small size which allows only a small amount of pressurized air to flow therethrough. The two solenoid valves 94, 96 are connected in parallel to the air source 98 and are connected in series to the air chamber 72. In the case where the cylinder housing 96 is elevated at a high speed, a large amount of pressurized air from the air source 98 bypasses the second solenoid valve 96, and flows into the air chamber 72 via only the first solenoid valve 94 that is being held at a position thereof shown in FIG. 4. In addition, in the case where the air pressure in the air chamber 72 is controlled or adjusted, the first valve 94 is switched to, and held at, an opposite position thereof and the second valve 94 is switched between two positions thereof so that a small amount of pressurized air from the air source 98 flows into the air chamber 72 or a small amount of pressurized air flows out of the air chamber 72. In the present embodiment, the two solenoid valves 94, 96 and the air source 98 cooperate with one another to provide a pressurized-air supplying device 101 as a pressurized-fluid supplying device, and the pressurized-fluid supplying device cooperates with the second air cylinder 56 as a pressing-force adjusting air cylinder to provide an adjustable-force applying device 102.

The two solenoid valves 94, 96 are normally held at the respective positions shown in FIG. 4, so that the air chamber 72 is communicated with the air source 98 and the cylinder housing 64 is held at an upper stroke-end position thereof where a linearly movable member 104 fixed to the lower surface of the housing 64 is held in contact with the piston rod 58.

As shown in FIG. 4, the linearly movable member 104 has a generally inverted-U-shaped cross section. The two side walls of the movable member 104 cooperate with each other to support an axis member 106 such that the axis member 106 extends parallel to the squeegee-move direction, i.e., the X-axis direction. The axis member 106 supports a pivotable member 108 such that the pivotable member 108 is pivotable about a straight line which is perpendicular to a straight line perpendicular to the screen and is parallel to another straight line parallel to the screen, i.e., is parallel to the squeegee-move direction or the X-axis direction.

A printing head 116 is attached to the lower surface of the pivotable member 108 via two load sensors 114 as a sort of pressing-force detecting devices. The printing head 116 includes a squeegee-support member 118 and a squeegee 120 supported by the member 188. The load sensors 114 and the printing head 116 are pivotable together with the pivotable member 108 about an axis line parallel to the squeegee-move direction, and are movable upward and downward by the first air cylinder 42 as a squeegee elevating and lowering air cylinder and the pressing-force adjusting air cylinder 56. Though the screen 10 and the screen frame are located below the X-axis slide 32, the X-axis slide 32 which has a frame structure does not interfere with the squeegee 120, and allows the squeegee 120 to be moved downward to a position below the slide 32 where the squeegee 120 is held in contact with the screen 10. In FIG. 3, the screen 10 and the PCB 20 are shown, for easier illustration purposes only, such that those elements 10, 20 are nearer to the squeegee 120 than they 10, 20 really are.

As shown in FIG. 1, two straight guide rods 124 as guided members are provided on the upper surface of the linearly movable member 104 such that the two guide rods 124 vertically extend at respective positions which are distant from each other in the Y-axis direction. The two guide rods 124 are respectively fitted in two guide cylinders 126 as guide members which are provided on the frame 38 such that the two guide cylinders 126 vertically extend. Each of the two guide rods 124 is slideable relative to a corresponding one of the two guide cylinders 126, in an axial direction of the each rod 124. A guide device 128 including the guide rods 124 and the guide cylinders 126 guides the vertical movement of the linearly movable member 104, the pivotable member 108, and the squeegee 120.

In addition, a pair of rods 130 are provided on the linearly movable member 104 such that the two rods 130 vertically extend at respective positions which are distant from each other in the Y-axis direction. Two grasping devices 132 which are attached to the frame 38 grasp and release the two rod 130, respectively, so that the linearly movable member 104 is fixed at a predetermined height position or is allowed to move upward or downward.

Each of the load sensors 114 has an elongate shape, and has four strain gauges (not shown) which cooperate with one another to provide a bridge circuit. A strain of each of the strain gauges is converted by the bridge circuit into an electric signal, and the electric signal is supplied to a control device 100 via a signal processing circuit (not shown). The two load sensors 114 are provided, between the pivotable member 108 and the squeegee-support member 118, at respective positions which are distant from each other in the Y-axis direction, such that each of the load sensors 114 extends parallel to the Y-axis direction. An upper portion of one of lengthwise opposite end portions of each of the two load sensors 114 is fixed to the pivotable member 108, and a lower portion of the other end portion of the each load sensor 114 is fixed to the squeegee-support member 118. Each of the two load sensors 114 is attached to the pivotable member 108 and the squeegee-support member 118, such that a small space is left between the above-indicated other end portion of the each sensor 114 and the pivotable member 108 and a small space is left between the above-indicated end portion of the each sensor 114 and the squeegee-support member 118. Therefore, when a load is applied to the each sensor 114, a strain is produced in one of the four strain gauges of the each sensor 114.

As shown in FIG. 1, the squeegee-support member 118 has an elongate shape, and extends in a direction perpendicular to the squeegee-move direction, i.e., in a direction parallel to the Y-axis direction. The squeegee 120 is detachably attached to the support member 118. The squeegee 120 is formed of rubber, and has an elongate plate-like shape. The squeegee 120 is supported by the squeegee-support member 118 such that the squeegee 120 extends perpendicularly to the squeegee-move direction and such that a lower end portion of the squeegee 120 is inclined relative to a plane perpendicular to the screen 10. The linearly movable member 104, the pivotable member 108, the load sensors 114, and the squeegee-support member 118 cooperate with one another to provide a squeegee supporting device 134.

Figure 5:
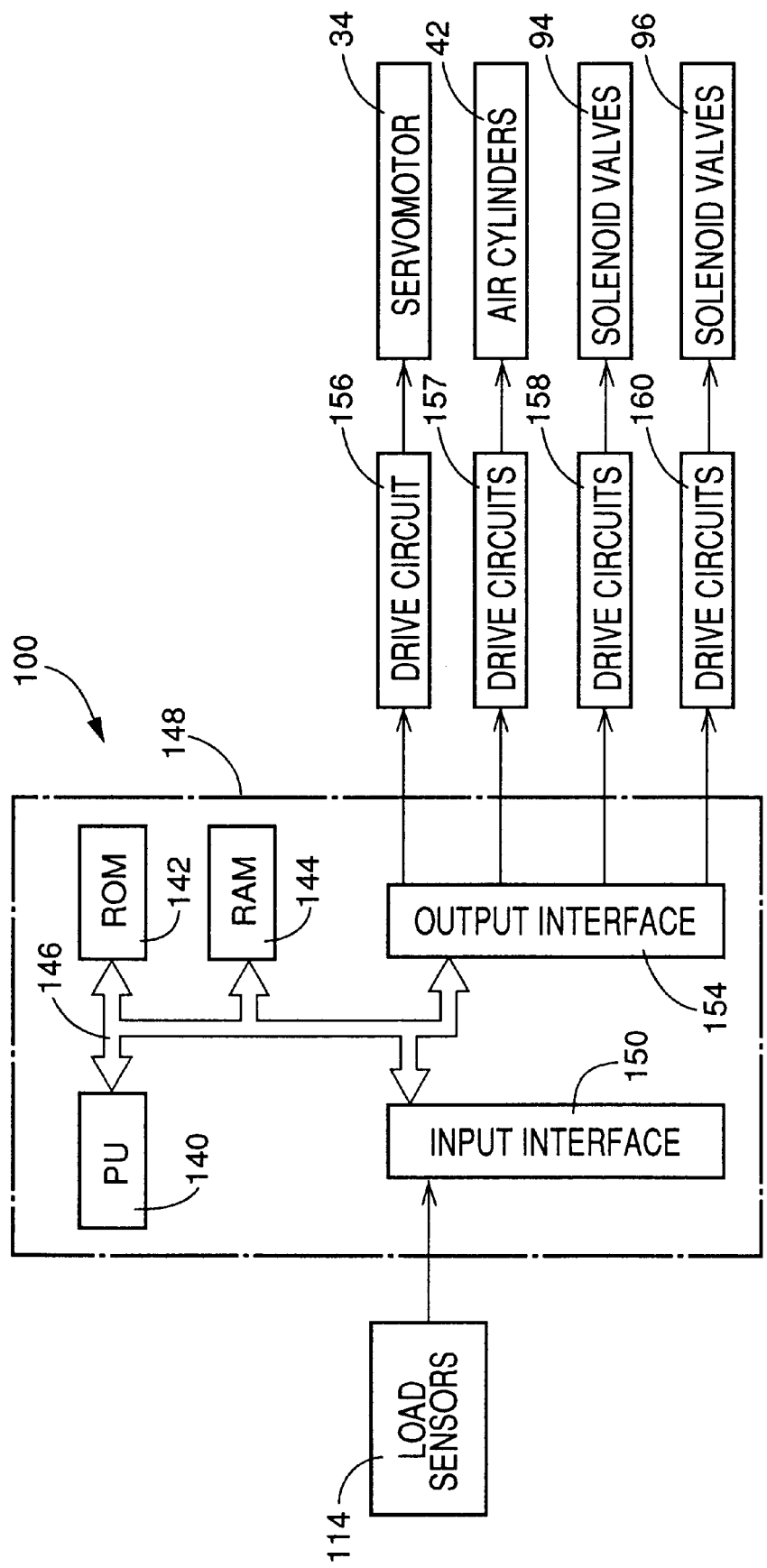
FIG. 5 is a diagrammatic view of a relevant portion of a control device of the printing machine of FIG. 1.

As shown in FIG. 5, the control device 100 is essentially provided by a computer 148 including a processing unit (PU) 140, a read only memory (ROM) 142, a random access memory (RAM) 144, and a bus 146 which connects those elements 140, 142, 144 to one another. An input interface 150 is connected to the bus 146, and the load sensors 114 are connected to the input interface 150. The bus 146 is connected to an output interface 154, which is connected via respective drive circuits 156, 157, 158, 160 to the servomotor 34, the two squeegee elevating and lowering air cylinders 42 (more accurately, two solenoid valves each of which switches the supplying of pressurized air to either one of two air chambers of a corresponding one of the two air cylinders 42 each as a double-action-type air cylinder), the first solenoid valves 94, and the second solenoid valves 96.

Next, there will be described the operation of the present creamed-solder printing machine constructed as described above.

In the present creamed-solder printing machine, the two squeegee units 40 alternately carry out respective printing operations. At the beginning, both the two squeegee units 40 are positioned at one of opposite ends of a movement area in which the units 40 are movable for printing. When the two units 40 are moved toward the other end of the movement area, first, an upstream-side one of the two units 40 as seen in the direction of the movement of the units 40 is operated to lower the squeegee 120 so that the squeegee 120 is pressed on the screen 10 with a desirable pressing force. The other, downstream-side unit 40 is not operated, and the squeegee 120 of the other unit 40 remains at its upper-stroke end, i.e., does not contact the screen 10. That is, in the other unit 40, the piston rod 46 of the squeegee elevating and lowering air cylinder 42 is held at its retracted position, and the cylinder housing 64 of the pressing-force adjusting air cylinder 56 is held at its upper stroke-end position where the linearly movable member 104 is held in contact with the piston rod 58.

If, in the above-indicated state, the X-axis slide 32 is moved and the one squeegee unit 40 is moved on the screen 10, the creamed solder placed on the screen 10 is squeezed by the squeegee 120 so that the creamed solder is moved on the screen 10 while the solder is printed on the PCB 20 through the holes of the screen 10. The other squeegee unit 40 is moved with the one squeegee unit 40, while being held at its upper stroke-end position. After the printing is finished, the PCB 20 is moved away from the screen 10 and carried out. Subsequently, another PCB 20 is is held in contact with the screen 10, and another printing is carried out on the new PCB 20. The second printing is carried out by the other squeegee unit 40. More specifically, the squeegee 120 of the one unit 40 is moved upward away from the screen 10, and the squeegee 120 of the other unit 40 is moved downward and is held in pressed contact with the screen 10. Then, the other unit 40 is moved in the direction opposite to the direction in which the one unit 40 has been moved to print the creamed solder on the first PCB 20. Thus, the squeegee 120 of the other unit 40 prints the creamed solder on the second PCB 20.

When the squeegee 120 of each of the two squeegee units 40 is lowered, the grasping device 132 releases the linearly movable member 104 and, first, the squeegee 120 is lowered by the squeegee elevating and lowering air cylinder 42 to a position slightly above the screen 10 (in the present embodiment, 3 mm above the screen 10). Subsequently, the squeegee 120 is lowered by the pressing-force adjusting air cylinder 56. More specifically described, the first solenoid valve 94 is switched to the position thereof where the valve 94 causes the air chamber 72 to be communicated with the atmosphere via the second solenoid valve 96. Thus, the pressurized air is flown from the air chamber 72 and accordingly the cylinder housing 64 is lowered. Thus, the squeegee 120 is pressed on the screen 10, with the respective loads of the members which are lowered by the air cylinder 56, and with the biasing force of the compression coil spring 86.

A pressing force, $F_C$, with which the squeegee 120 is pressed on the screen 10 is expressed by the following first equation (1):

$$F_C = F_B - F_A + W_A + W_B + W_C \qquad (1)$$

where $F_A$ is an adjustable force applied by the pressing-force adjusting air cylinder 56 against the biasing force of the compression coil spring 86, $F_B$ is the biasing force of the coil spring 86, $W_A$ is the total weight of the linearly movable member 104, the pivotable member 108 and the axis member 106, $W_B$ is the total weight of the two load sensors 114, and $W_C$ is the total weight of the squeegee-support member 116 and the squeegee 120.

The pressing-force adjusting air cylinder 56 is operated in the state in which the bottom wall 66 does not contact the medium-diameter portion 88 of the piston 62. The air cylinder 56 applies, based on the air pressure acting on the bottom wall 66, an adjustable force resisting the biasing force of the coil spring 86. Thus, the pressing force with which the squeegee 120 is pressed on the screen 10 is decreased as such. The lower the air pressure in the air chamber 72 is, the smaller the force applied by the air cylinder 56 is, and the greater the pressing force is. The pressing force is detected by the two load sensors 114. The second solenoid valve 96, i.e., the air pressure of the air chamber 72 is controlled by the control device 100 such that the pressing force detected by the load sensors 114 is equal to a pre-set value which has been input and stored in the ROM 142 or the RAM 144. Thus, the squeegee 120 is pressed on the screen 10 with the pre-set force.

A pressing force, $F_D$, detected by the two load sensors 114 is expressed by the following second equation (2):

$$F_D = F_C - W_C \qquad (2)$$

Each of the two load sensors 114 is so calibrated as to detect a pressing force with which the squeegee-support member 118 and the squeegee 120 are pressed by a portion of the each sensor 114 that is on the side of the squeegee-support member 118. In addition, the computer 148 of the control device 100 is so adapted as to calculate the sum of the detected value $F_D$ and the value $W_C$ and treat the sum as if it were the value detected by the sensors 114, i.e., as if the sensors 114 would detect the pressing force with which the squeegee 120 is pressed on the screen 10. More specifically described, for example, in the state in which the squeegee 120 is not held in contact with the screen 10, the pressing force $F_C$ is actually zero, whereas the detected value $F_D$ of the sensors 114 is a negative value and is not equal to the pressing force $F_C$. Therefore, the computer 148 modifies the value $F_D$ actually detected by the sensors 114 by adding the value $W_C$ to the detected value $F_D$, and uses the thus modified value $F_D'$ that takes zero in the state in which the pressing force $F_C$ is zero. Therefore, as far as the present embodiment is concerned, the load sensors 114 are regarded as a detector which detects the pressing force with which the squeegee 120 is pressed on the screen 120.

The control device 100 compares the thus modified value $F_D'$ with the pre-set value, and controls the second solenoid valve 96 so that the modified value $F_D'$ is equal to the pre-set value. When the modified value $F_D'$ is smaller than the pre-set value, the second solenoid valve 96 is switched to its position where the valve 96 allows the air chamber to be communicated with the atmosphere, and when the modified value $F_D'$ is greater than the pre-set value, the second solenoid valve 96 is switched to its position where the valve 96 allows the air chamber to be communicated with the air source 98. Thus, the squeegee 120 is pressed on the screen 10 with the pre-set pressing force, and the creamed solder is accurately printed on the PCB 20. The control device 100 continues to control the second solenoid valve 96 in this manner even during the printing operation. Therefore, even in the case where the degree of parallelism between the plane of the screen 10 and the direction of movement of the X-axis slide 32 is considerably low, the pressing force with which the squeegee 120 is pressed on the screen 10 is maintained at the pre-set value, and accordingly an accurate printing is obtained. The grasping device 134 keeps the squeegee units 40 released during the printing operation.

The squeegee 120 is supported by the linearly movable member 104 such that the squeegee 120 is pivotable about an axis line parallel to the squeegee-move direction. Therefore, even in the case where the screen 10 or the PCB 20 is inclined about a straight line parallel to the squeegee-move direction, the squeegee 120 is pivoted about the axis member 106 to follow the inclined screen 10 or PCB 20. Thus, the creamed solder is uniformly printed on the entirety of the PCB 20.

In the present embodiment, no sealing member is provided between the cylinder housing 64 and the large-diameter portion 70 or the small-diameter portion 68 of the piston 62 of the pressing-force adjusting air cylinder 56. The small-diameter portion 68 of the piston 62 can be regarded as a portion of the piston rod 58. Therefore, the adjustable force applied by the air cylinder 56 is prevented from being varied by the frictional force which would be produced by one or more sealing members. This feature also contributes to improving the accuracy of adjustment of the pressing force with which the squeegee 120 is pressed on the screen 10.

In the pressing-force adjusting air cylinder 56, no sealing member is employed as described above, and substantially no clearance is provided between the piston 62 and the cylinder housing 64. However, since the air cylinder 56 is connected via the universal joint 54 to the squeegee elevating and lowering air cylinder 42 and accordingly the frame 38, substantially no force is produced to tilt the housing 64 and the piston 62 relative to each other. Thus, the piston 62 are prevented from being caught in the housing 64. This feature also contributes to improving the accuracy of adjustment of the pressing force with which the squeegee 120 is pressed on the screen 10.

The squeegee 120 is moved toward, and away from, the screen 10, in two steps, by the squeegee elevating and lowering air cylinder 42 and the pressing-force adjusting air cylinder 56. The squeegee elevating and lowering air cylinder 42 elevates and lowers the squeegee 120, irrespective of the adjustment of the pressing force. Therefore, the air cylinder 42 can elevate and lower the squeegee 120, at high speeds, to move quickly the squeegee 120 toward and away from the screen 10.

As described previously, the distance between the spring retainer 50 and the universal joint 54 can be adjusted by changing the amount of engagement of the nut 61 with the threaded portion 60 of the joint 54. The set load of the compression coil spring 86 can be adjusted by adjusting the above-indicated distance. The variation of the biasing force of the coil spring 86 can be minimized by adjusting the set load of the spring 86 to the most appropriate value.

As is apparent from the foregoing description, a portion of the control device 100 that switches the second solenoid valve 96 based on the value detected by the load sensors 114, provides an adjustable-force adjusting device which adjusts the adjustable force applied to the squeegee 120 by the adjustable-force adjusting air cylinder 56. The squeegee elevating and lowering air cylinder 42 and the pressing-force adjusting air cylinder 56 cooperate with each other to provide a squeegee elevating and lowering device as a sort of squeegee moving device which moves the squeegee 120 toward and away from the screen 10. Thus, the pressing-force adjusting air cylinder 56 functions as not only the adjustable-force applying device but also the squeegee elevating and lowering device.

In the illustrated embodiment, the piston rod 58 of the pressing-force adjusting air cylinder 56 is connected to the frame 38 via the single universal joint 54. Thus, the piston rod 58 is almost prevented from being tilted relative to the cylinder housing 64 and accordingly caught in the housing 64. In the case where the housing 64 is connected to the squeegee 120 via another universal joint, the piston rod 58 is more effectively prevented from being caught in the housing 64.

In the illustrated embodiment, the squeegee 120 is lowered at a high speed by the squeegee elevating and lowering air cylinder 42, subsequently is contacted with the screen 10 at a low speed by the pressing-force adjusting air cylinder 56, and then is stopped at a position which assures that the squeegee 120 is pressed on the screen 10 with a desirable pressing force. However, it is possible to obtain the desirable pressing force by pressing the squeegee 120 on the screen 10 with the greatest possible pressing force and then reducing the greatest pressing force to the desirable pressing force. For example, the first solenoid valve 94 is switched to its position where the valve 94 allows the air chamber of the air cylinder 56 to be communicated with the atmosphere via the first and second solenoid valves 94, 96, so that the cylinder housing 64 is lowered to its lower stroke-end position where the bottom wall 66 contacts the medium-diameter portion 88 of the piston 62. In this state, the air cylinder 42 lowers the squeegee 120. When the load sensors 114 detects the greatest pressing force, the control device 100 stops the air cylinder 42 from lowering the squeegee 120. In this state, the second solenoid valve 96 is switched to its position where the valve 96 allows the air chamber 72 to be communicated with the air source 98. Thus, the air pressure in the air chamber 72 increases, which leads to producing a force to move the cylinder housing 64 upward. Thus, the pressing-force adjusting air cylinder 56 applies, to the squeegee 120, an adjustable force which resists the biasing force of the compression coil spring 86. The higher the air pressure in the air chamber 72 is, the smaller the pressing force is. Therefore, the control device 100 controls the air pressure in the air chamber 72 based on the value detected by the load sensors 114, and thus provides the desirable pressing force. In this modified case, the pressing-force adjusting air cylinder 56 is used exclusively for adjusting the pressing force, and only the squeegee elevating and lowering air cylinder 42 provides the squeegee elevating and lowering device that is a sort of squeegee moving device.

Each of the two squeegees 120 may be moved toward, and away from, the screen 10 by a single pressurized-fluid-operated cylinder device which functions as both the squeegee elevating and lowering device and the pressing-force adjusting device. This arrangement is advantageous for the case where the distance between the screen 10 and the each squeegee 120 being positioned at its upper stroke-end position is short, i.e., the case where an elastic member which produces a biasing force is not so largely elastically deformed.

The creamed-solder printing operation involves the relative movement between each squeegee 120 and the screen 10 in the direction parallel to the screen 10. Therefore, though each squeegee 120 is moved relative to the screen 10 in the illustrated embodiment, the screen 10 may be moved relative to each squeegee 120, or both each squeegee 120 and the screen 10 may be moved in opposite directions.

In the illustrated embodiment, the pressing force with which each squeegee 120 is pressed on the screen 10 is adjusted for the purpose of carrying out an accurate printing. However, the pressing force may need be adjusted for the purpose of preventing the screen 10 from being damaged. For example, in place of the squeegees 120 formed of rubber, one or more squeegees formed of a synthetic resin, a metal plate, etc. may be employed. In the latter cases, the screen 10 can be prevented from being damaged, by adjusting the pressing force with which the squeegee or each of the squeegees is pressed on the screen 10.

In the illustrated embodiment, the small-size solenoid valve 96 is used to control the air pressure in the air chamber 72 of the pressing-force adjusting air cylinder 56, and the large-size solenoid valve 94 is used to supply a large amount of pressurized air to the air cylinder 56 and thereby operate the same 56 at a high speed. However, the large-size valve 94 may be omitted. The solenoid-operated direction control valves 94, 96 may be replaced with solenoid-operated proportional control valves.

It is to be understood that the present invention may be embodied with other changes, improvements, and modifications that may occur to those skilled in the art without departing from the scope and spirit of the invention defined in the appended claims.

What is claimed is:

1. A creamed-solder printing machine for printing a creamed solder on a printed circuit board, comprising:

a screen having a plurality of holes;

a squeegee which prints the creamed solder on the printed circuit board through the holes of the screen;

a frame which supports the squeegee such that the squeegee is movable toward, and away from, the screen;

at least one elastic member which is provided between the frame and the squeegee and which produces a biasing force to bias the squeegee in a direction toward the screen; and an adjustable-force applying device which is provided between the frame and the squeegee and which applies, to the squeegee, an adjustable force in a direction in which the adjustable force resists the biasing force of the elastic member, the adjustable-force applying device comprising at least one pressurized-fluid-operated cylinder device which includes a piston, a piston rod, and a cylinder housing; and a pressurized-fluid supplying device which supplies a pressurized fluid to the pressurized-fluid-operated cylinder device and adjusts a pressure of the pressurized fluid, wherein one of the piston rod and the cylinder housing is supported by the frame, the other of the piston rod and the cylinder housing is connected to the squeegee, and the elastic member is provided between the frame and said other of the piston rod and the cylinder housing.

2. A printing machine according to claim 1, wherein the pressurized-fluid-operated cylinder device comprises a pressurized-air-operated cylinder device, and wherein the piston and the piston rod of the pressurized-air-operated cylinder device are slideable on an inner surface of the cylinder housing thereof, without any sealing members provided therebetween.

3. A printing machine according to claim 1, further comprising a universal joint with which at least one of the piston rod and the cylinder housing is connected to a corresponding one of the frame and the squeegee.

4. A printing machine according to claim 1, wherein the piston rod is supported by the frame, and the cylinder housing is connected to the squeegee.

5. A printing machine according to claim 1, further comprising a squeegee supporting device which supports the squeegee and which is connected to said other of the piston rod and the cylinder housing that is connected to the squeegee.

6. A printing machine according to claim 5, wherein the squeegee supporting device comprises:

a linearly movable member which is supported by the frame such that the linearly movable member is movable along a first straight line perpendicular to the screen; and a pivotable member which is connected to the linearly movable member such that the pivotable member is pivotable about a second straight line perpendicular to the first straight line and parallel to the screen, the squeegee being supported by the pivotable member.

7. A printing machine according to claim 1, further comprising:

a squeegee supporting device which supports the squeegee and which is supported by the frame via the adjustable-force applying device; and a pressing-force detecting device which is supported by the squeegee supporting device and which detects a pressing force of the squeegee applied to the screen.

8. A printing machine according to claim 7, further comprising an adjustable-force adjusting device which is connected to the pressing-force detecting device and the adjustable-force applying device and which automatically adjusts the adjustable force of the adjustable-force applying device such that the pressing force detected by the pressing-force detecting device is equal to a reference value.

* * * * *